(12) United States Patent
Camden et al.

(10) Patent No.: US 11,079,421 B2
(45) Date of Patent: Aug. 3, 2021

(54) SELF-TEST PROCEDURE FOR A CONTROL DEVICE

(71) Applicant: Lutron Technology Company LLC, Coopersburg, PA (US)

(72) Inventors: Richard S. Camden, Coopersburg, PA (US); Jordan H. Crafts, Bethlehem, PA (US); Vidur Garg, Allentown, PA (US); Kevin L. Gascho, Bethlehem, PA (US); Alexander F. Mosolgo, Pompano Beach, FL (US); Dragan Veskovic, Allentown, PA (US); Sean R. Pearson, Valencia, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 16/271,726

(22) Filed: Feb. 8, 2019

(65) Prior Publication Data

US 2019/0250201 A1 Aug. 15, 2019

Related U.S. Application Data

(60) Provisional application No. 62/628,650, filed on Feb. 9, 2018.

(51) Int. Cl.
*G01R 29/26* (2006.01)
*G01R 31/44* (2020.01)
(Continued)

(52) U.S. Cl.
CPC ............ *G01R 29/26* (2013.01); *G01R 31/44* (2013.01); *H04B 17/14* (2015.01); *H04B 17/23* (2015.01);
(Continued)

(58) Field of Classification Search
CPC ........ G01R 29/26; G01R 31/44; H05B 45/50; H05B 47/19; H05B 47/105; H04B 17/23; H04B 17/345; H04B 17/14
See application file for complete search history.

(56) References Cited

U.S. PATENT DOCUMENTS 5,248,919 A 9/1993 Hanna et al.
6,456,471 B1 * 9/2002 Haun .................. H01H 71/125
361/42

(Continued)

FOREIGN PATENT DOCUMENTS

EP 1714529 B1 4/2011
JP H0549069 A 2/1993

*Primary Examiner* — Tung X Nguyen
*Assistant Examiner* — Feba Pothen
(74) *Attorney, Agent, or Firm* — Michael Czarnecki; Glen Farbanish; Philip Smith

(57) ABSTRACT

A control module for a lighting fixture may include an input circuit (e.g., a wireless communication circuit) that may be susceptible to noise generating by a noise-generating source (e.g., a lighting control device in the lighting fixture). The control circuit may execute a self-test procedure to determine if the magnitude of the noise is acceptable or unacceptable for normal operation of the control module. During the self-test procedure, the control circuit may measure a noise level at a connection of the input circuit and determine if the noise level causes the self-test procedure to fail. The control circuit may control the lighting load to multiple intensities, measure noise levels of the output signal at each intensity, and process the noise levels to determine if the test has passed or failed. The control circuit may illuminate a visual indicator to provide an indication that the self-test procedure has failed.

25 Claims, 5 Drawing Sheets

(51) Int. Cl.
  *H05B 47/105* (2020.01)
  *H04B 17/23* (2015.01)
  *H04B 17/345* (2015.01)
  *H04B 17/14* (2015.01)
  *H05B 45/50* (2020.01)
  *H05B 47/19* (2020.01)

(52) U.S. Cl.
  CPC ........... *H04B 17/345* (2015.01); *H05B 45/50* (2020.01); *H05B 47/105* (2020.01); *H05B 47/19* (2020.01)

(56) References Cited

U.S. PATENT DOCUMENTS

| | | | |
|---|---|---|---|
| 6,803,728 B2 | 10/2004 | Balasubramaniam et al. | |
| 8,009,042 B2* | 8/2011 | Steiner | H05B 47/19 340/541 |
| 8,199,010 B2 | 6/2012 | Sloan et al. | |
| 8,228,184 B2 | 7/2012 | Blakeley et al. | |
| 8,410,706 B2 | 4/2013 | Steiner et al. | |
| 8,451,116 B2 | 5/2013 | Steiner et al. | |
| 8,471,779 B2 | 6/2013 | Mosebrook | |
| 9,413,171 B2 | 8/2016 | Neyhart | |
| 9,595,880 B2 | 3/2017 | Knode et al. | |
| 9,679,696 B2 | 6/2017 | Bhutani et al. | |
| 9,820,361 B1* | 11/2017 | Turvy, Jr. | H05B 47/19 |
| 2002/0080027 A1* | 6/2002 | Conley, III | H05B 47/19 340/540 |
| 2012/0281606 A1 | 11/2012 | Cooney et al. | |
| 2013/0030589 A1 | 1/2013 | Pessina et al. | |
| 2014/0192723 A1* | 7/2014 | Schenk | H04W 84/18 370/328 |
| 2014/0265568 A1 | 9/2014 | Crafts et al. | |
| 2014/0340215 A1 | 11/2014 | Piccolo, III et al. | |
| 2015/0179058 A1 | 6/2015 | Crafts et al. | |
| 2016/0029459 A1 | 1/2016 | Ushirosako et al. | |
| 2017/0041886 A1 | 2/2017 | Baker et al. | |
| 2017/0123390 A1 | 5/2017 | Barco et al. | |
| 2017/0125875 A1 | 5/2017 | Courtney et al. | |
| 2019/0141818 A1 | 5/2019 | Pearson et al. | |
| 2019/0188997 A1* | 6/2019 | Gilson | H04Q 9/00 |

* cited by examiner

SELF-TEST PROCEDURE FOR A CONTROL DEVICE

CROSS-REFERENCE TO RELATED APPLICATIONS

This application claims the benefit of U.S. Provisional Patent Application No. 62/628,650, filed Feb. 9, 2018, the entire disclosure of which is hereby incorporated by reference.

BACKGROUND

A user environment, such as a residence or an office building for example, may be configured using various types of load control systems. A lighting control system may be used to control the lighting loads in the user environment. A motorized window treatment control system may be used to control the natural light provided to the user environment. A heating, ventilation, and air-conditioning (HVAC) system may be used to control the temperature in the user environment.

Each load control system may include various control devices, including input devices and load control devices. The load control devices may be capable of directly controlling an electrical load. The input devices may be capable of indirectly controlling the electrical load via messages transmitted to the load control device. The input devices and the load control devices may include wireless communication circuits for communicating messages (e.g., digital messages) via wireless signals, such as, radio-frequency (RF) signals. The load control devices may receive, via the RF signals, load control instructions for controlling an electrical load from one or more of the input devices. The wireless communication circuits may be susceptible to noise generated by noise-generating sources, such as load control circuits of the load control devices or other noise sources in the user environment.

SUMMARY

A control device, such as a control module for a lighting fixture including a lighting load, may comprise an input circuit (e.g., a wireless communication circuit) that may be susceptible to noise generating by a noise-generating source (e.g., a lighting control device in the lighting fixture). The input circuit may generate an output signal at a connection. The control device may comprise a control circuit configured to receive the output signal and control the lighting load. The control circuit may be configured to execute a self-test procedure to determine if the magnitude of the noise generated by the noise-generating source is acceptable or unacceptable for normal operation of the control module. During the self-test procedure, the control circuit may measure a noise level of the output signal and determine if the noise level causes the self-test procedure to fail. The control circuit may provide an indication that indicates whether the self-test procedure has passed or failed. For example, the control circuit may illuminate a visual indicator to provide an indication that the self-test procedure has failed.

In addition, the control circuit may control the noise-generating source to a first state and measure a first noise level of the output signal when the noise-generating source is in the first state. The control circuit may also control the noise-generating source to a second state and measure a second noise level of the output signal when the noise-generating source is in the second state. The control circuit may process the first and second noise levels and to provide the indication of a result of the processing of the first and second noise levels.

DETAILED DESCRIPTION

Figure 1:
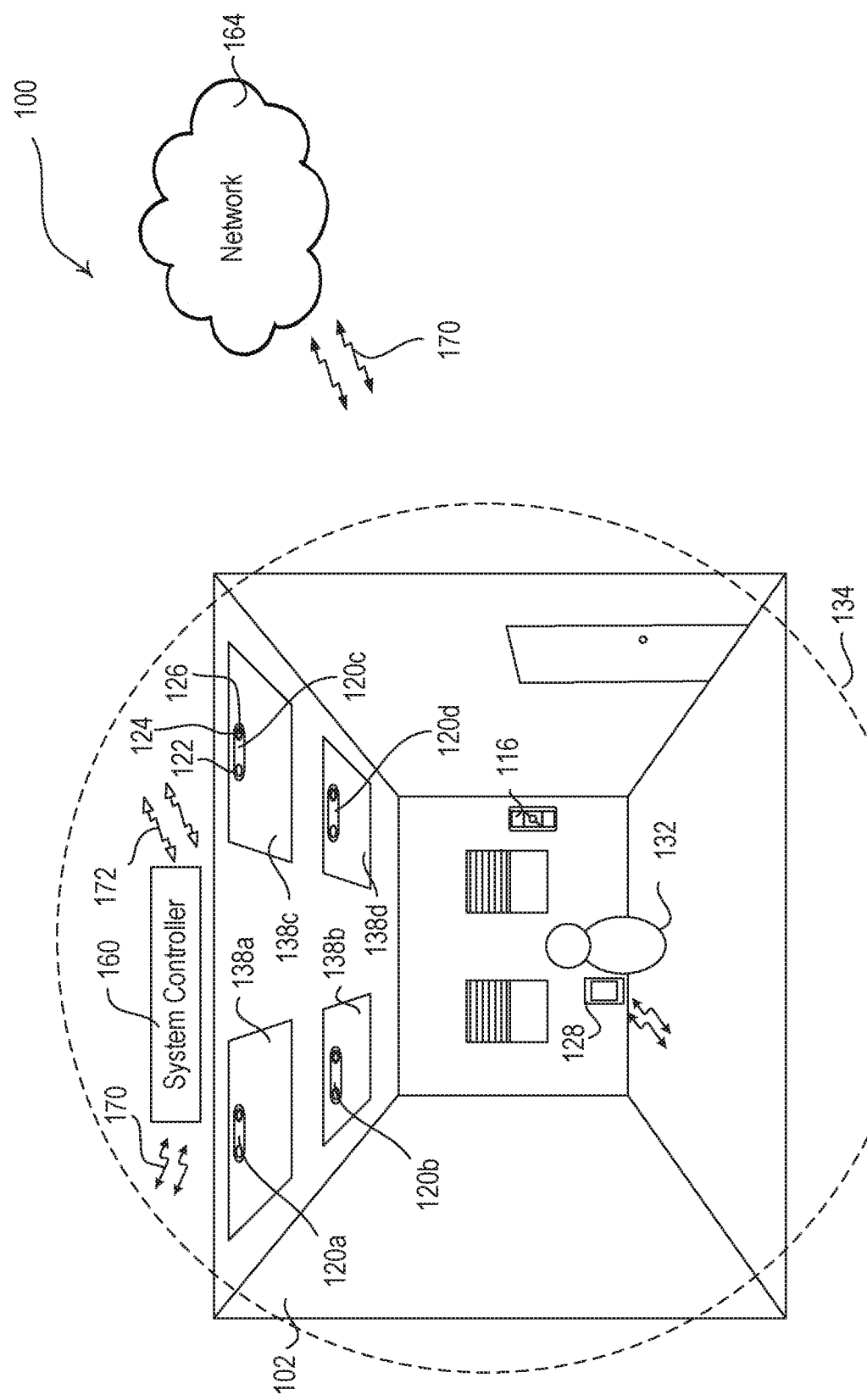
FIG. 1 is a diagram depicting an example load control system that includes lighting control devices.

FIG. 1 depicts an example of a representative load control system 100, which may include control devices installed in a load control environment 102 (e.g., a room in a building). The control devices of the load control system may include lighting control devices (e.g., LED drivers) configured for controlling lighting loads (e.g., LED light sources) installed in one or more lighting fixtures 138*a*, 138*b*, 138*c*, 138*d*. The lighting control devices of the lighting fixtures 138*a*-138*d* may also be ballasts, dimming modules, switching modules, or other lighting control devices. The lighting control devices may be control-target devices capable of controlling a respective lighting load in response to control instructions received in messages.

The control devices of the load control system 100 may include one or more control-source devices that may be configured to control the lighting loads of the lighting fixtures 138*a*-138*d*. The control-source devices may be input devices capable of communicating messages (e.g., digital messages) to control-target devices. The control-source devices may send messages that indirectly control the amount of power provided to a lighting load by transmitting messages to the lighting control device. The messages may include control instructions (e.g., load control instructions) or another indication that causes the lighting control device to determine load control instructions for controlling a lighting load.

The control-source devices may include wired or wireless devices. An example control-source device may include a remote control device 116. The remote control device 116 may communicate with control-target devices, such as the lighting control devices in the lighting fixtures 138*a*-138*d*, via a wired and/or a wireless communication link. For example, the remote control device 116 may communicate via radio frequency (RF) signals 172. The RF signals 172 may be transmitted via any known RF communication technology and/or protocol (e.g., near field communication (NFC); BLUETOOTH®; WI-FI®; ZIGBEE®, a proprietary communication channel, such as CLEAR CONNECT™, etc.). The remote control device 116 may be attached to the wall or detached from the wall. Examples of remote control devices are described in greater detail in U.S. Pat. No. 5,248,919, issued Sep. 28, 1993, entitled LIGHTING CONTROL DEVICE; U.S. Pat. No. 8,471,779, issued Jun. 25, 2013, entitled WIRELESS BATTERY POWERED REMOTE CONTROL WITH LABEL SERVING AS ANTENNA ELEMENT; and U.S. Patent Application Publication No. 2014/0132475, published May 15, 2014, entitled WIRELESS LOAD CONTROL DEVICE, the entire disclosures of which are hereby incorporated by reference.

The control devices of the load control system 100 may also include control modules, such as control modules 120a, 120b, 120c, 120d. The control modules 120a-120d may each be attached to a respective lighting fixture 138a-138d. The control modules 120a-120d may each be electrically connected to a respective lighting control device within the lighting fixtures 138a-138d for controlling lighting loads. The control modules 120a-120d may include one or more internal sensing circuits for controlling the lighting loads within the respective lighting fixtures 138a-138d. For example, the control modules 120a-120d may operate as occupancy sensors and/or daylight sensors. Each control module 120a-120d may be a control-target device (e.g., responsive to messages transmitted by a control-source device, such as the remote control device 116) and/or a control-source device (e.g., configured to control a control-target device, such as the lighting control devices of the lighting fixtures 138a-138b).

The control modules 120a-120d may include internal communication circuits (e.g., wired or wireless communication circuits) for transmitting and receiving messages (e.g., digital messages). For example, the control modules 120a-120d may be control-source devices that transmit messages to respective lighting control devices to which they are connected (e.g., on a wired communication link). The control modules 120a-120d may also, or alternatively, be control-target devices for receiving messages from other devices in the system, such as the remote control device 116 or another control-source device, (e.g., on a wireless communication link via the RF signals 172) for controlling the respective lighting control devices to which they are connected.

The control modules 120a-120d may be configured to detect occupancy and/or vacancy conditions in the load control environment 102 in which the load control system 100 is installed in response to internal occupancy sensing circuits. Each control module 120a-120d may comprise a lens (e.g., similar to lens 202 shown in FIG. 2A) through which the internal occupancy sensing circuit may receive energy (e.g., infrared energy) for detecting occupants in the load control environment 102. The control modules 120a-120d may control the lighting control devices in the respective lighting fixtures 138a-138d in response to the occupancy sensing circuits detecting the occupancy and/or vacancy conditions. The control modules 120a-120d may be configured to turn the lighting loads of the respective lighting fixtures 138a-138d on in response to detecting an occupancy condition and off in response to detecting a vacancy condition. The control modules 120a-120d may also operate as vacancy sensors to only turn off the lighting loads in response to detecting vacancy conditions (e.g., the lighting loads may not be turned on in response to detecting occupancy conditions). Examples of load control systems having occupancy and/or vacancy sensors are described in greater detail in U.S. Pat. No. 8,009,042, issued Aug. 10, 2011, entitled RADIO-FREQUENCY LIGHTING CONTROL SYSTEM WITH OCCUPANCY SENSING; U.S. Pat. No. 8,199,010, issued Jun. 12, 2012, entitled METHOD AND APPARATUS FOR CONFIGURING A WIRELESS SENSOR; and U.S. Pat. No. 8,228,184, issued Jul. 24, 2012, entitled BATTERY-POWERED OCCUPANCY SENSOR, the entire disclosures of which are hereby incorporated by reference.

The control modules 120a-120d may be configured to measure a total light intensity in the visible area of the load control environment 102 in which the load control system 100 is installed in response to internal daylight sensing circuits. Each control module 120a-120d may comprise a light pipe 124 (e.g., similar to light pipe 208 shown in FIG. 2A) for conducting the light from the load control environment 102 to the internal daylight sensing circuit. The control modules 120a-120d may control the lighting control devices in the respective lighting fixture 138a-138d in response to the light intensity measured by the respective daylight sensing circuit. Examples of load control systems having daylight sensors are described in greater detail in U.S. Pat. No. 8,410,706, issued Apr. 2, 2013, entitled METHOD OF CALIBRATING A DAYLIGHT SENSOR; and U.S. Pat. No. 8,451,116, issued May 28, 2013, entitled WIRELESS BATTERY-POWERED DAYLIGHT SENSOR, the entire disclosures of which are hereby incorporated by reference. In addition, the light pipe 124 may be illuminated by an internal light source (e.g., an LED) to provide feedback to the occupants of the load control environment 102. Each control module 120a-120d may comprise an actuator 126 (e.g., similar to button 206 shown in FIG. 2A) that may be actuated to control the lighting load in the respective lighting fixture 138a-138d and/or to configure the control module 120a-120b and/or lighting control devices in the respective lighting fixture 138a-138d.

The load control system 100 may include a system controller 160 operable to transmit and/or receive messages via wired and/or wireless communications. For example, the system controller 160 may be configured to transmit and/or receive the RF signals 172, to communicate with one or more control devices (e.g., control-source devices and/or control-target devices, such as the control modules 120a-120d). The system controller 160 may communicate messages between associated control devices. The system controller 160 may be coupled to one or more wired control devices (e.g., control-source devices and/or control-target devices) via a wired digital communication link.

The system controller 160 may also, or alternatively, communicate via RF signals 170 (e.g., NFC; BLUETOOTH®; WI-FI®; cellular; a proprietary communication channel, such as CLEAR CONNECT™, etc.). The system controller 160 may communicate over a network 164, such as the Internet, using RF signals 170. The RF signals 170 may be transmitted using a different protocol and/or wireless band than the RF signals 172. For example, the RF signals 170 may be transmitted using WI-FI® or cellular signals and the RF signals 172 may be transmitted using another RF communication protocol, such as BLUETOOTH®, ZIGBEE®, or a proprietary communication protocol. The RF signals 170 may be transmitted using the same protocol and/or wireless band as the RF signals 172. For example, the RF signals 170 and the RF signals 172 may be transmitted using WI-FI® or a proprietary communication protocol.

The system controller 160 may be configured to transmit and receive messages between control devices. For example, the system controller 160 may transmit messages to the lighting control devices in the lighting fixtures 138a-138d in response to the messages received from the remote control device 116. The system controller 160 may transmit messages to the control modules 120a-120d (e.g., in response to the messages received from the remote control device 116). The messages may include association information for being stored at the control devices and/or control instructions for controlling a lighting load.

The load control system 100 may be commissioned to enable control of the lighting loads in the lighting fixtures 138a-138d based on commands communicated from the control devices (e.g., the remote control device 116, the control module 120a-120d, etc.) configured to control the lighting loads. For example, the remote control device 116 may be associated with the lighting control devices within the lighting fixtures 138a-138d and/or the control modules 120a-120d. Association information may be stored on the associated devices, which may be used to communicate and identify digital commands at associated devices for controlling electrical devices in the system 100. The association information may include the unique identifier of one or more of the associated devices. The association information may be stored at the control devices (e.g., at the control modules 120a-120d), or at other devices that may be implemented to enable communication and/or identification of digital commands between the control devices.

A network device 128 may be in communication with the system controller 160 for commissioning the load control system 100. The network device may include a wireless phone, a tablet, a laptop, a personal digital assistant (PDA), a wearable device (e.g., a watch, glasses, etc.), or another computing device. The network device 128 may be operated by a user 132. The network device 128 may communicate wirelessly by sending messages on RF signals 170 (e.g., WI-FI®, signals, WI-MAX® signals, cellular signals, etc.). The network device 128 may communicate messages in response to a user actuation of one or more buttons on the network device 128. The network device 128 may communicate with the system controller 160 using messages transmitted via RF signals 170 (e.g., WI-FI®, signals, WI-MAX® signals, cellular signals, etc.). Examples of load control systems having WI-FI®-enabled devices, such as smart phones and tablet devices, are described in greater detail in U.S. Patent Application Publication No. 2013/0030589, published Jan. 11, 2013, entitled LOAD CONTROL DEVICE HAVING INTERNET CONNECTIVITY; and U.S. Pat. No. 9,413,171, issued Aug. 9, 2016, entitled NETWORK ACCESS COORDINATION OF LOAD CONTROL DEVICES, the entire disclosures of which are incorporated herein by reference.

The commissioning of the load control system 100 may include associating control devices, which may include control-source devices and/or control-target devices. A load control discovery device, such as the remote control device 116, may initiate discovery and/or association of control devices (e.g., the control modules 120a-120d) with the system controller 160. Once control devices are associated, control-source devices may send messages to control-target devices to perform control of the lighting loads in the load control system 100. For example, the associated remote control device 116 may send messages to the control modules 120a-120d to instruct the respective lighting control devices of the lighting fixtures 138a-138d to increase or decrease the lighting level of the respective lighting loads.

The location of control devices may be discovered relative to the location of other control devices in the load control environment 102. As shown in FIG. 1, control devices (e.g., control-source devices and/or control-target devices) may send a message within a discovery range 134 that may be received by other control devices within the discovery range 134. The message may be a dedicated discovery message that may be identified by a receiving device as a discovery message or another message that may be transmitted in the load control environment 102 and may be interpreted as a discovery message. For example, the message may be an association message for associating devices in the load control environment 102, and/or the message may be a control message for controlling devices in the load control environment 102.

A control device that sends a discovery message (e.g., dedicated discovery message or a message otherwise interpreted as a discovery message) may be identified as the load control discovery device. FIG. 1 shows an example in which the remote control device 116 is assigned as the load control discovery device that may send a discovery message within discovery range 134, though other control devices may be assigned as the load control discovery device. The discovery message sent by the remote control device 116 may be received by other devices, such as the control modules 120a-120d and/or the system controller 160. The discovery range 134 may correspond to a transmission power (e.g., an adjustable transmission power) of the remote control device 116 and/or a reception threshold of the other devices (e.g., the control modules 120a-120d and/or the system controller 160).

The control devices (e.g., the control modules 120a-120d) may receive the discovery message and determine whether the discovery message is received at a signal strength that is above a reception power threshold (e.g., a predefined signal strength). The control devices that receive the discovery message may report the receipt of the discovery message. The control devices that receive the discovery message may report the received signal strength of the discovery message to the system controller 160. The control devices that received the discovery message may be provided to the network device 128. The network device 128 may display the discovered control devices to the user 132 for association with a location and/or other control devices.

The control devices (e.g., the control modules 120a-120d) within the discovery range 134 may be responsive to a discovery message transmitted from the remote control device 116. Each control device may calculate the received signal strength indicators (RSSIs) of each respective discovery message received. The system controller 160 and/or the network device 128 may organize the control devices according to the RSSI of each respective discovery message received.

The transmission of the discovery message may be triggered by actuation of a button on the remote control device 116 and/or receipt of a discovery trigger message. For example, the remote control device 116 or one of the control modules 120a-120d may be identified as the load control discovery device. The user 132 may actuate a button (e.g., for a predefined period of time) or a sequence of buttons to cause the remote control device 116 to transmit the discovery message.

The control devices may transmit a message to the system controller 160 to acknowledge receipt of the discovery message. The messages may include the device identifier of the load control discovery device (e.g., the remote control device 116) and/or a signal strength at which the discovery message was received. The messages may be sent to the system controller 160 in response to a request from the system controller 160 (e.g., after the system controller 160 receives the discovery message itself). The request from the system controller 160 may include a request to acknowledge receipt of a message from a device having the device identifier of the load control discovery device and/or the received signal strength of the message.

The system controller 160 may provide the discovered devices to the network device 128 for display to the user 132. The system controller 160 may organize the discovered devices for display to the user 132 for performing association. The system controller 160 may organize the discovered control devices in an organized dataset (e.g., ascending or descending list) that is organized by the signal strength at which the discovery message was received at each device. The system controller 160 may remove any devices from the dataset that receive the discovery message at a signal strength below a predefined threshold (e.g., the reception power threshold). The system controller 160 may include a predefined number of devices in the dataset that have the greatest signal strength. The system controller 160 may send the organized dataset to the network device 128 for displaying to the user 132.

The user 132 may select control devices (e.g., control modules 120a-120d of the lighting fixtures 138a-138d) from the discovered devices displayed on the network device 128. The selected control devices may be associated with the load control discovery device that was used to discover the control devices with the discovery range 134. The network device 128 may generate association information regarding the load control discovery device and the selected control devices in response to the inputs received from the user 132. The selected control devices may also be associated with a control device (e.g., a control-source device) other than the load control discovery device. Additionally or alternatively, the actuator 126 of each control module 120a-120d may be actuated to select the respective control module to be associated with the load control discovery device.

The network device 128 may transmit the association information to the system controller 160 (e.g., upon actuation of a button by the user 132). The system controller 160 may store the updated association information thereon. The system controller 160 may transmit the association information to the control devices to update the association information stored at the control devices.

One or more of the circuits of the control modules 120a-120d (e.g., the internal communication circuits and/or sensing circuits) may be susceptible to noise, such as electro-magnetic interference (EMI) noise and/or radio-frequency interference (RFI) noise. The noise may be generated by one or more noise-generating sources located inside of the control modules, located in the lighting fixtures 138a-138d, and/or located in the load control environment external to the lighting fixtures 138a-138d. For example, one or more of the lighting control devices and/or the lighting loads in the lighting fixtures 138a-138d may generate noise that may interfere with the operation of the wireless communication circuits of the control modules 120a-120d (e.g., because the lighting control devices and/or lighting loads are located at close proximity to the control modules in the lighting fixtures). The magnitude of the noise may be great enough to exceed the magnitude of received wireless signals or close enough to the magnitude of the received wireless signals (e.g., low signal-to-noise ratio) such that the wireless communication circuit is not able to interpret the received wireless signals from the noise and thus not able to process the received wireless signals. The noise may cause one or more of the control modules 120a-120d to not be responsive to wireless signals transmitted by some control devices of the load control system 100 and may decrease the wireless communication range (e.g., wireless reception range) of the control modules. In addition, a wireless communication circuit, such as an RF transceiver, of an external control device may generate noise that disrupts the operation of an internal occupancy sensing circuit of the one of the control modules 120a-120d. The control modules 120a-120d may be coupled to other types of electrical loads that may interfere with the operation of the circuits of the control modules 120a-120d, such as, for example, heating, ventilation, and air-conditioning (HVAC) loads, motor loads, power supplies, communication equipment, medical equipment, and appliances.

Each of the control modules 120a-120d may be configured to execute a self-test procedure to determine if the magnitude of the noise generated by the noise-generating source(s) is acceptable to ensure proper operation of the control modules after installation or to determine if the magnitude of the noise generated by the noise-generating source(s) is unacceptable (e.g., the noise is so great that received wireless signals cannot be appropriately interpreted above the noise and proper operation cannot be guaranteed). For example, the control modules 120a-120d may be configured to control the noise-generating source(s) to one or more states (e.g., by turning the lighting control devices in the lighting fixtures 138a-138d on and off) and measuring the magnitude of the noise in each state. Upon determining that the magnitude of the noise is acceptable or unacceptable, the control modules 120a-120d may provide feedback that the test has passed or failed, respectively. For example, the control modules 120a-120d may blink a visual indicator (e.g., the light pipe 124) a first color (e.g., green) if the test has passed or a second color (e.g., red) if the test has failed. The control modules 120a-120d may also flash the lighting loads of the respective lighting fixtures 138a-138d to indicate that the test has failed. In addition, the control modules 120a-120d may transmit a message indicating whether the test has passed or failed, and the result may be displayed for a user, for example, on a visible display of the network device 128.

The self-test procedure may be executed at different times during the lifetime of the control modules. For example, the control modules 120a-120d may be configured to execute the self-test procedure during design and manufacturing of the lighting fixtures 138a-138d in which the control modules are installed, e.g., at an original equipment manufacturer (OEM) as part of an end-of-line (EOL) test. In response to an indication that the self-test procedure has failed by one of the control module 120a-120d, the construction of the lighting fixture may be modified until the control module passes the self-test (e.g., the control modules and/or lighting control devices of the lighting fixture may be mounted in other locations and/or in enclosures, and/or electrical wires may be rerouted through the lighting fixture). For example, the lighting control devices may be moved farther away from the control modules 120a-120d in the respective lighting fixtures 138a-138d and/or the lighting control devices may be mounted in shielding (e.g., metal) enclosures in the lighting fixtures.

The control modules 120a-120d may be also configured to execute the self-test procedure after installation of the respective lighting fixtures 138a-138d. Since the light pipe 124 of the each control module 120a-120d is directed towards the load control environment 102 when the control module is mounted to the respective lighting fixture 138a-138d, an installer of the lighting fixture 138a-138d (e.g., a contractor) may be able to easily determine if the control module 120a-120d has passed or failed the self-test procedure (e.g., by simply observing the light pipe to determine if the light pipe is blinking green or red). If one of the control modules 120a-120d has failed the self-test procedure, the installer may adjust the respective lighting fixture (e.g., by changing the location and/or orientation of the lighting fixture, and/or modifying the internal construction of the lighting figure) and/or may adjust the load control environment 102 (e.g., by moving objects such as equipment and furniture in the load control environment).

The control modules 120a-120d may be configured to execute the self-test procedure when the control modules are powered up. The control modules 120a-120d may be configured to execute the self-test procedure the first time that the control modules are powered up or each time that the control modules are powered up. After each control module 120a-120d has been powered up for a predetermined amount of time (e.g., 60 minutes), the control module may be configured to cease re-executing the self-test procedure when the control module is powered up. For example, each control module 120a-120d may be powered up continuously without interrupt for the predetermined amount of time before ceasing to re-execute the self-test procedure. In addition, if each control module 120a-120d is powered up for a total or cumulative amount of time that exceeds the predetermined amount of time, the control module may then cease re-executing the self-test procedure. Further, each control module 120a-120d may be configured to cease re-executing the self-test procedure after the control module is associated with another control device of the load control system 100 during commissioning of the load control system. Each control module 120a-120d may be configured to execute the self-test procedure each time that the control module turns on the lighting load of the respective lighting fixture 138a-138d. In addition, each control module 120a-120d may also be configured to execute the self-test procedure in response to an actuation of the actuator 126 and/or in response to receiving a message (e.g., from the system controller 160 via the RF signals 172 and/or the network device 128 via the RF signals 170).

The control modules 120a-120d may illuminate the light pipe 124 while the self-test procedure is being executed to indicate that testing is in progress. For example, each control module 120a-120d may blink the light pipe 124 between green and red while the control module is executing the self-test procedure until the control module begins to blink the light pipe 124 green to indicate that the test has passed or red to indicate that the test has failed. While the self-test procedure is on-going (e.g., before the test results are indicated), the control devices 120a-120d may not be responsive to actuations of the button 126 and/or messages received from other control devices. The control modules 120a-120d may be configured to exit the self-test procedure after a timeout period (e.g., five minutes) from first indication of the results of the self-test procedure (e.g., from when the control module begins to blink the light pipe 124 to indicate that the test has passed or failed). The control modules 120a-120d may also be configured to exit the self-test procedure in response to an actuation of the actuator 126 and or in response to receiving a message (e.g., from the system controller 160 via the RF signals 172 and/or the network device 128 via the RF signals 170).

Figure 2A:
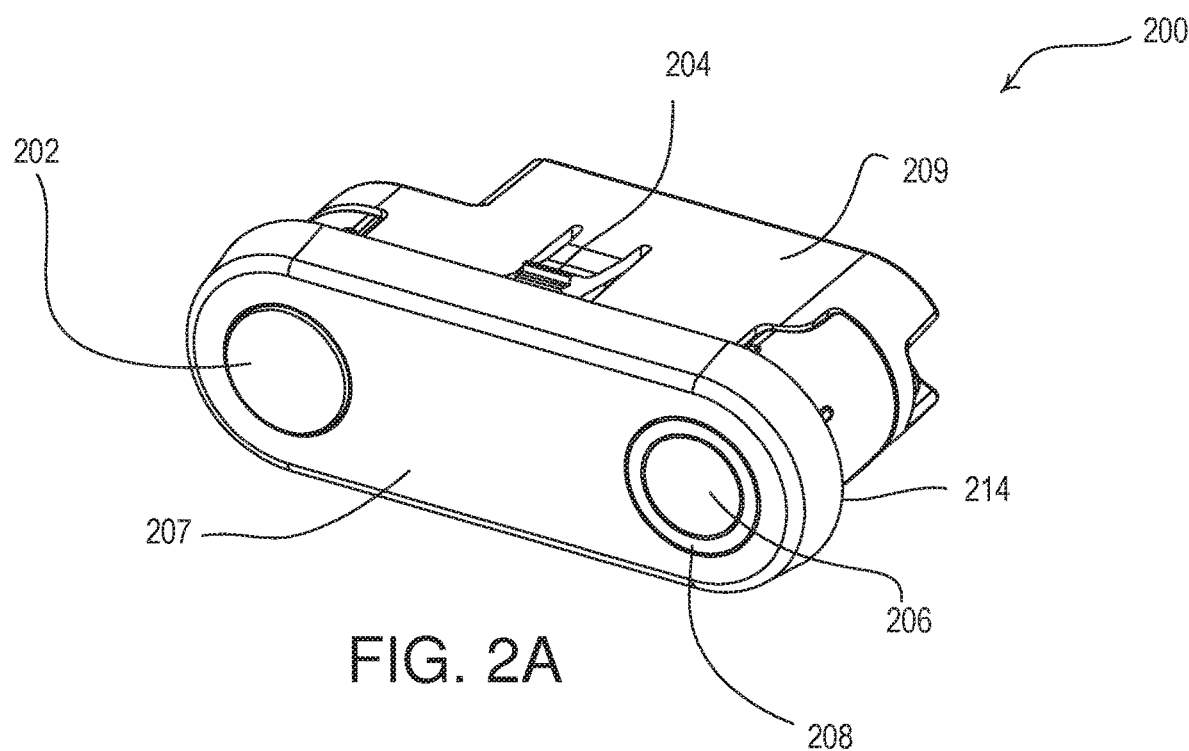
FIGS. 2A and 2B are perspective views depicting an example control module for a lighting control device.
Figure 2B:
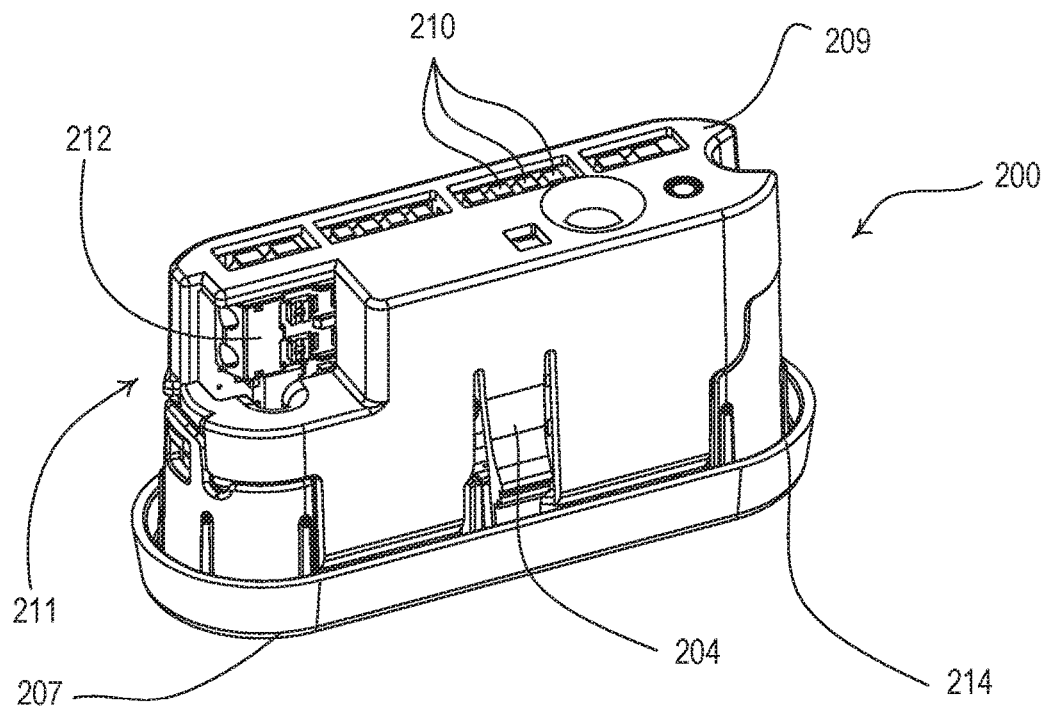

FIGS. 2A and 2B are perspective views depicting an example control module 200 for a lighting control device, which may be deployed as the control modules 120a-120d shown in FIG. 1. The control module 200 may be configured to attach to a lighting fixture and electrically connect to different types of lighting control devices, such as different types of LED drivers, for example. The control module 200 may be electrically connected to the lighting control device to enable control of the lighting control device in response to information provided from the control module 200. The control module 200 may comprise a control circuit for controlling the operation of the control module.

The control module 200 may be mounted to a lighting fixture. For example, the control module 200 may include a clip 204 configured for attachment to a lighting fixture. The clip 204 may be located on a side portion of the control module 200. The clip 204 may be received by the lighting fixture for locking the control module 200 into a receiving portion (e.g., an opening) of the lighting fixture.

The control module 200 may be configured with an occupancy sensor lens 202 (e.g., the lens 122 of the control modules 120a-120d shown in FIG. 1). The occupancy sensor lens 202 may be made of at least a partially infrared or visible light transparent material to allow for an occupancy sensing circuit (e.g., occupancy sensing circuit 306 shown in FIG. 3) located behind the occupancy sensing lens 202 to detect motion (e.g., occupancy and/or vacancy conditions) in the visible area of a load control environment. For example, the occupancy sensing circuit may be a passive infrared (PIR) sensor capable of sensing infrared energy in the load control environment or a camera capable of identifying motion in the load control environment. The occupancy sensor lens 202 may be located on a front cover portion 207 (e.g., located on a front side of the control module 200). When the control module 200 is installed in a ceiling of the load control embodiment, the front cover portion 207 and the occupancy sensor lens 202 may be directed downwards (e.g., exposed to the load control environment) to allow the occupancy sensing circuit to detect occupancy and/or vacancy conditions in the load control environment beneath the lighting fixture to which the control module 200 may be attached.

The control module 200 may be configured with a light pipe 208 (e.g., the light pipe 124 of the control modules 120a-120d shown in FIG. 1), which may be made of a light-transmissive material, such as clear plastic. The light pipe 208 may be configured to receive light (e.g., daylight) from a load control environment and conduct the light to a light sensing circuit (e.g., daylight sensing circuit 304 shown in FIG. 3), such as a photosensor or a photodiode, located inside the control module 200. The light pipe 208 may be configured to allow light to enter the control module 200 through the front cover portion 207 of the control module 200. The light pipe 208 may be configured to conduct the light from a front surface of the light pipe 208 to the daylight sensing circuit inside of the control module 200 to allow for the daylight sensing circuit to measure an amount of daylight in the load control environment beneath the lighting fixture to which the control module 200 may be attached.

The light pipe 208 may also be configured to transmit light from an internal light source (e.g., light source 314 shown in FIG. 3) located inside of the control module 200 to the front surface of the light pipe to provide feedback to a user. For example, the light pipe 208 may provide feedback (e.g., by flashing the light source in one or more colors) to communicate information during configuration of the control module 200 (e.g., to indicate when the control module is in an association mode or a discovery mode) and/or during normal operation to indicate a status of the control module and/or the load being controlled by the control module 200 (e.g., a fault condition, such as a failed lamp). The front surface of the light pipe 208 may be located on the front cover portion 207 of the control module 200 to allow for an occupant of the load control environment to see the feedback. The light pipe 208 may also be illuminated to provide feedback to a user during a self-test procedure of the control module 200.

The control module 200 may include a configuration button 206 (e.g., the actuator 126 of the control modules 120a-120d shown in FIG. 1). Actuation of the configuration button 206 may enable programming of the control module and/or the lighting control device to which the control module is connected. For example, the actuation of the configuration button 206 may put the control module 200, and/or the lighting control device to which the control module 200 is connected, in an association mode or a discovery mode. In the association mode, the control module 200 and/or the lighting control device may transmit and/or receive association messages for being associated with other devices. In the discovery mode, the control module 200 and/or the lighting control device may transmit and/or respond to discovery messages for being discovered with other devices. In addition, the control module 200 may be configured to change a communication frequency at which RF signals (e.g., the RF signals 172) are transmitted and/or received in response to actuations of the configuration button 206. Further, the control module 200 may be configured to restore the control module 200 to an initial setting (e.g., to factory defaults) in response to actuations of the configuration button 206. The configuration button 206 may also be actuated to start and/or end a self-test procedure of the control module.

The configuration button 206 may be located on the front cover portion 207 of the control module 200 to allow for access by an occupant of the load control environment. The configuration button 206 may be surrounded by the light pipe 208. For example, the configuration button 206 may be surrounded by the light pipe 208 to conserve space on the front cover portion 207 of the control module 200.

As shown in FIG. 2B, the control module 200 may include programming contacts 210. The programming contacts 210 may be used to program a memory of the control circuit (e.g., similar to memory 318 shown in FIG. 3) with programming information during manufacturing of the control module and/or in the field. For example, the control circuit of the control module 200 may use the programming information stored in the memory to determine the messages to send to the lighting control device to which the control module 200 is connected. In addition, the programming information may include the lighting levels to which to control the lighting load controlled by the lighting control device in response to input signals received by the control module 200. The input signals may be occupancy/vacancy conditions sensed by the control module 200, daylight levels sensed by the control module 200, RF signals received by the control module 200, and/or other input signals received by the control module 200. The programming contacts 210 may also, or alternatively, test the programmed functions of the control module 200 (e.g., as part of an end-of-line test during manufacturing of the control module 200).

The programming contacts 210 may be received through a rear cover portion 209 located on a rear side of the control module 200. The programming contacts 210 may be visible through the rear cover portion 209 of the control module to enable programming of the control module prior to installation into a fixture. After the control module 200 is installed in the lighting fixture, the programming contacts 210 may be hidden or inaccessible (e.g., covered by a label) to prevent the programming from being modified without disconnecting the control module 200 from the lighting fixture. The control module 200 may include a communication link connector 212. The communication link connector 212 may be configured to be connected to a Digital Addressable Lighting Interface (DALI) communication link, a LUTRON® ECOSYSTEM® communication link, or another wired digital or analog communication link. The communication link connector 212 may be located in a receded side portion 211 of the control module 200.

The front cover portion 207 of the control module 200 may include a lip 214. The lip 214 may be configured to rest against the edge of the fixture, such that the front cover portion 207 extends below the fixture. The clip 204 may be located at a position on a side portion of the control module 200 that connects to the receiving portion of the lighting fixture such that the lip 214 rests against the edge of the fixture.

Figure 3:
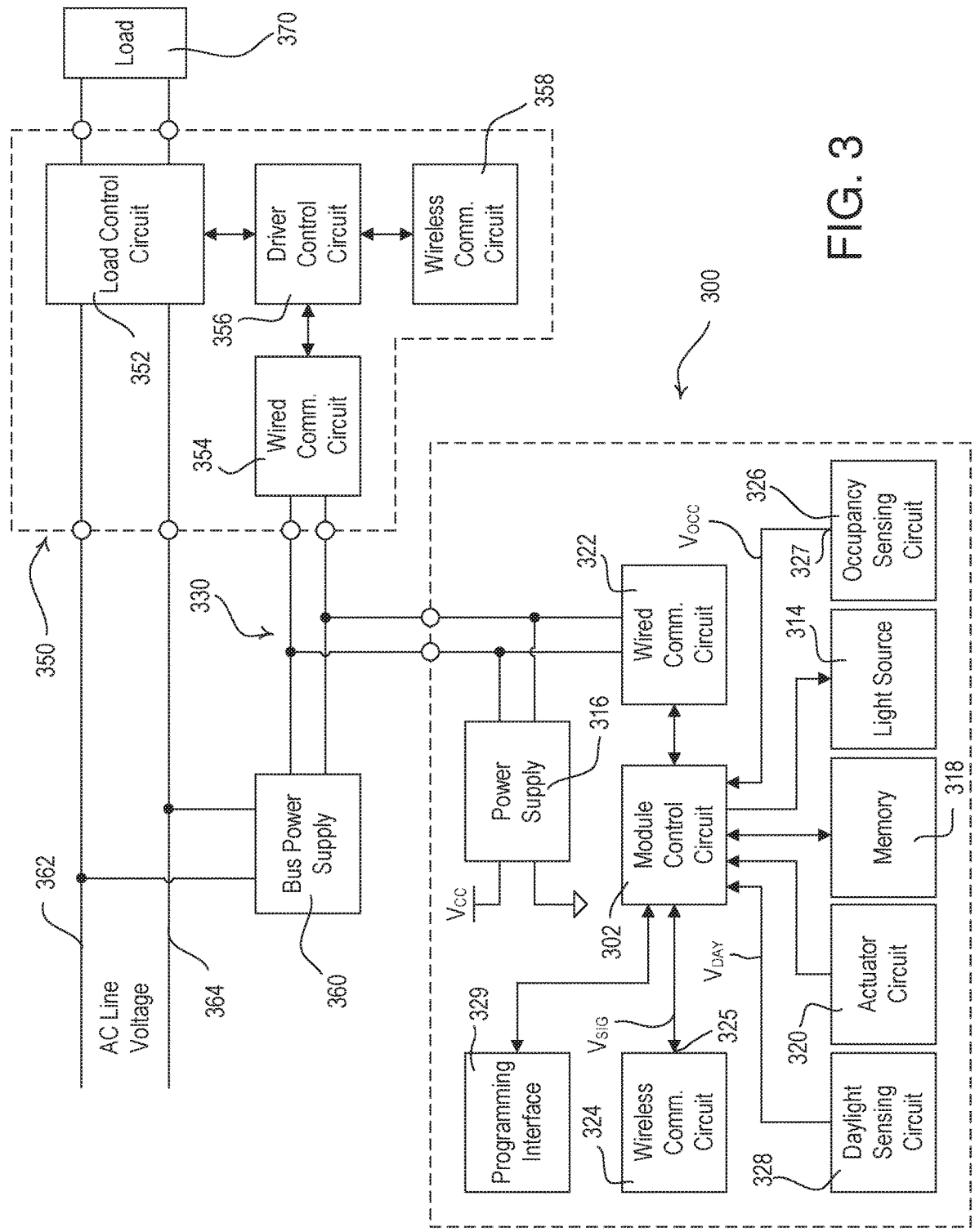
FIG. 3 is a block diagram of an example control module connected to a lighting control device.

FIG. 3 is a block diagram of an example control device, such as a control module 300, which may be deployed as one of the control modules 120a-120d shown in FIG. 1 and/or the control module 200 shown in FIG. 2. The control module 300 may be configured to control a lighting control device 350, which may be coupled to a lighting load 370 (e.g., an LED light source or other lighting load) for control of the intensity of the lighting load. For example, the lighting control device 350 may be an LED driver for LED light sources, an electronic ballast for lamps, or other lighting control device. The control module 300, the lighting control device 350, and the lighting load 370 may be mounted in a lighting fixture, such as the lighting fixtures 138a-138d shown in FIG. 1. For example, the control module 300 may be configured to mount to a lighting fixture in which the lighting control device 350 and the lighting load 370 may be installed. The control module 300 may be connected to the lighting control device 350 to perform sensing functions for controlling the lighting control device 350 and/or to communicate wireless signals with external devices. The control module 300 may be configured to be connected to different types of lighting control devices, such as different types of LED drivers, for example.

The control module 300 may be electrically connected to the lighting control device 350 via a communication link 330 (e.g., a wired communication link). The communication link 330 may be a digital communication link, such as a Digital Addressable Lighting Interface (DALI) communication link, a LUTRON® ECOSYSTEM® communication link, or another wired communication link. The communication link 330 may be connected to the control module 300 and/or the lighting control device 350 via a communication link connector, which may be similar to the communication link connector 212 described herein. The control module 300 may send signals via the communication link 330 (e.g., control instructions for controlling the lighting control device 350). The control module 300 may receive signals via the communication link 330 (e.g., feedback from the lighting control device 350). The communication link 330 may be powered by a bus power supply 360. The bus power supply 360 may receive power via a hot connection 362 and a neutral connection 364 of an alternating current (AC) line voltage and may provide an amount of power to the communication link 330. The communication link 330 may also comprise an analog communication link, such as a 0-10V control link.

The lighting control device 350 may comprise a wired communication circuit 354 that may be connected to the communication link 330. The connection of the communication link 330 to the wired communication circuit 354 may enable the communication between the control module 300 and the lighting control device 350 to remain local (e.g., within a lighting fixture). The wired communications circuit 354 may transmit information to and/or receive information from the control module 300 via the communication link 330.

The wired communications circuit 354 may be in communication with a driver control circuit 356 for transmitting and/or receiving information via the communication link 330. The driver control circuit 356 may include one or more general purpose processors, special purpose processors, conventional processors, digital signal processors (DSPs), microprocessors, integrated circuits, a programmable logic device (PLD), application specific integrated circuits (ASICs), or the like. The driver control circuit 356 may perform signal coding, data processing, power control, input/output processing, or any other functionality that enables the lighting control device 350 to perform as described herein. The driver control circuit 356 may generate control instructions for controlling the lighting load 370. The driver control circuit 356 may send the control instructions to a load control circuit 352 for performing load control in response to the instructions. The load control circuit 352 may receive instructions from the driver control circuit 356 and may control the lighting load 370 based on the received instructions. For example, the driver control circuit 356 may control the load control circuit 352 to turn the lighting load 370 on and off, to adjust an intensity (e.g., a brightness) of the lighting load 370, and/or to adjust a color (e.g., color temperature) of the lighting load 370. The load control circuit 352 may receive power via the hot connection 362 and the neutral connection 364 of an alternating current (AC) line voltage.

The control module 300 may include a module control circuit 302, which may be similar to the control circuit of the control module 200 described herein, for controlling the functionality of the control module 300. The module control circuit 302 may process information received as input and generate messages for being communicated via the communication link 330 to the lighting control device 350. The module control circuit 302 may include one or more general purpose processors, special purpose processors, conventional processors, digital signal processors (DSPs), microprocessors, integrated circuits, a programmable logic device (PLD), application specific integrated circuits (ASICs), or the like. The module control circuit 302 may perform signal coding, data processing, power control, input/output processing, or any other functionality that enables the module control circuit 302 to perform as described herein. The module control circuit 302 may store information in and/or retrieve information from a memory 318. For example, the memory 318 may maintain a registry of associated control devices. The memory 318 may include a non-removable memory and/or a removable memory. The control module 300 may comprise an internal power supply 316 for generating a direct-current (DC) supply voltage $V_{CC}$ for powering the low-voltage circuitry of the control module 300. The power supply 316 may receive power from the bus power supply 360.

The module control circuit 302 may include one or more general purpose processors, special purpose processors, conventional processors, digital signal processors (DSPs), microprocessors, microcontrollers, integrated circuits, programmable logic devices (PLD), field programmable gate arrays (FPGA), application specific integrated circuits (ASICs), or any suitable controller or processing device or the like. The module control circuit 302 may be configured to execute one or more software-based applications that include instructions that when executed by the control circuit may configure the control circuit to perform signal coding, data processing, power control, input/output processing, or any other functionality that enables the control module 300 to perform as described herein. One will recognize that features and processes described herein may also and/or alternatively be provided by firmware and/or hardware in addition to/as an alternative to software-based instructions. The module control circuit 302 may store information in and/or retrieve information from the memory 318. The memory 318 may also store software-based instructions for execution by the module control circuit 302 and may also provide an execution space as the control circuit executes instructions.

The control module 300 may include one or more input circuits. For example, the input circuits of the control module 300 may comprise one or more user interface circuits, such as an actuator circuit 320, for receiving a user input (e.g., in response to an actuation of a button, such as the configuration button 206 and/or a capacitive touch surface). In addition, the input circuits may comprise one or more communication circuits, such as a wired communication circuit 322 and/or a wireless communication circuit 324. Further, the input circuits may comprise one or more sensing circuits, such as an occupancy sensing circuit 326 and/or a daylight sensing circuit 328. Finally, the input circuits may comprise a programming interface 329 (e.g., similar to the programming contacts 210 described herein).

The actuator circuit 320 may include one or more buttons for receiving an input (e.g., an indication that a button has been actuated) at the control module 300. The module control circuit 302 may receive inputs from the actuator circuit 320 to put the module control circuit 302 in an association mode or a discovery mode as described herein. The module control circuit 302 may receive inputs from the programming interface 329 to program and/or test the control module 300. For example, the module control circuit 302 may receive inputs from the programming interface 329 to program the memory 318 with programming information regarding messages (e.g., digital messages) to be sent to the lighting control device 350 in response to inputs received from the actuator circuit 320, the wired communication circuit 322, the wireless communication circuit 324, the occupancy sensing circuit 326, and/or the daylight sensing circuit 328.

The module control circuit 302 may control the wired communications circuit 322 to transmit information to and/or receive information from the lighting control device 350 via the communication link 330. The module control circuit 302 may be configured to control the lighting control device 350 via the communication link 330 to turn the lighting load 370 on and off. The module control circuit 302 may be configured to control the lighting control device 350 to adjust the intensity of the lighting load 370 between a high-end intensity $L_{HE}$ (e.g., approximately and/or equal to 100%) and a low-end intensity $L_{LE}$ (e.g., approximately 0.1%-10%). The module control circuit 302 may also be configured to control the lighting control device 350 to adjust the color (e.g., color temperature) of the lighting load 370.

The wireless communication circuit 324 may comprise an RF communication circuit coupled to an antenna for transmitting and/or receiving wireless signals (e.g., the RF signals 172). The wireless communications circuit 324 may transmit and/or receive messages via a wireless communications channel (e.g., near field communication (NFC); BLUETOOTH®; WI-FI®); ZIGBEE®, a proprietary communication channel, such as CLEAR CONNECT™, etc.). The wireless communications circuit 324 may include a transmitter, a receiver, a transceiver, or other circuit capable of performing wireless communications. The wireless communications circuit 324 may be in communication with the module control circuit 302 for transmitting and/or receiving information. In response to receiving a wireless signal, the wireless communication circuit 324 may generate an output signal $V_{SIG}$ at a connection 325 of the wireless communication circuit. The module control circuit 302 may receive the output signal $V_{SIG}$ of the wireless communication circuit 324 and control the lighting load 370 in response to the output signal $V_{SIG}$. In addition, the lighting control device 350 may comprise a wireless communication circuit 358 coupled to the driver control circuit 356 for transmitting and/or receiving wireless signals.

The occupancy sensing circuit 326 may be configured to detect motion (e.g., occupancy and/or vacancy conditions) in the area in which the control module 300 is installed. Examples of the occupancy sensing circuit 326 may include a passive infrared (IR) sensor capable of sensing infrared energy in the load control environment or a camera capable of identifying motion in the load control environment. The module control circuit 302 may be coupled to the occupancy sensing circuit 324 for detecting the occupancy or vacancy conditions. The occupancy sensing circuit 324 may generate an occupancy control signal $V_{OCC}$ at a connection 327 of the occupancy sensing circuit. The module control circuit 302 may receive the occupancy control signal $V_{OCC}$, and may be configured to turn on the lighting load 370 in response to detecting an occupancy condition and/or turn off the lighting load in response to detecting a vacancy condition. The occupancy sensing circuit 326 may be similar to the occupancy sensing circuit of the control module 200 described herein.

The daylight sensing circuit 328 may be configured to measure a light intensity in the area in which the control module 300 is mounted. The daylight sensing circuit 328 may generate a daylight control signal $V_{DAY}$ that may indicate the measured light intensity and may be provided to the module control circuit 302. The module control circuit 302 may be configured to adjust the intensity of the lighting load 370 in response to the daylight control signal $V_{DAY}$. The daylight sensing circuit 328 may be similar to the daylight sensing circuit of the control module 200 described herein.

The load control circuit 352 may send status feedback to the driver control circuit 356 regarding the status of the load 370. The status may be communicated to the control module 300 and communicated to a user by illuminating an internal light source 314 (e.g., an LED), which may illuminate a light pipe of the control module (e.g., similar to the light pipe 126 of the control modules 120a-120d shown in FIG. 1 and/or the light pipe 208 of the control module 200 shown in FIG. 2A). The light source 314 may be controlled (e.g., flashed) by the module control circuit 302. The light source 314 may comprise a single LED that may be capable of illuminating the light pipe a single color and/or multiple LEDs that may be capable of illuminating the light pipe different colors.

The input circuits may be susceptible to noise (e.g., EMI and/or RFI noise) that may be generated by one of more noise-generating sources located inside of the control module 300, located in the lighting fixture in which the control module is installed, and/or located in the load control environment in which the control module is installed. For example, the lighting control device 350 (e.g., the load control circuit 352 of the lighting control device) and/or the lighting load 370 may generate noise that may interfere with the operation of the wireless communication circuit 324 of the control module 300. In addition, the wireless communication circuit 358 of the lighting control device 350 and/or the wireless communication circuit 324 of the control module 300 may generate noise that may disrupt the operation of the occupancy sensing circuit 326 of the control module 300.

The module control circuit 302 may be configured to execute a self-test procedure, for example, to determine if the magnitude of the noise generated by the lighting control device 350 and/or the lighting load 370 is at an acceptable level to ensure that the control module 300 may be able to execute proper wireless communication after installation. The module control circuit 302 may be configured to execute the self-test procedure when the control module 300 is powered up (e.g., the first time that the control module is power up or each time that the control module is powered up). In addition, after the control module 300 has been powered up for a predetermined amount of time (e.g., 60 minutes), the module control circuit 302 may be configured to cease re-executing the self-test procedure when the control module is powered up. For example, the module control circuit 302 may comprise a timer for measuring how long the control module 300 has been powered up and may set a flag in the memory 318 when the control module has been powered up for more than the predetermined amount of time. In addition, the module control circuit 302 may be configured to execute the self-test procedure each time that the module control circuit controls the lighting control device 350 to turn on the lighting load 370. The module control circuit 302 may also be configured to execute the self-test procedure in response to an actuation of a button of the actuator circuit 320 (e.g., the actuator 126 shown in FIG. 1) and/or in response to receiving a message via the wired communication circuit 322 and/or the wireless communication circuit 324.

While the self-test procedure is being executed, the module control circuit 302 may be configured to control the light source 314 to illuminate the light pipe to indicate that testing is in progress. For example, the module control circuit 302 may blink the light pipe between two different colors (e.g., between green and red) while the module control circuit is executing the self-test procedure. During the self-test procedure (e.g., before the module control circuit 302 begins to illuminate the light source 314 to indicate the test result), the module control circuit 302 may not process and/or respond to actuations of the buttons of the actuator circuit 314 and/or messages received via the wired communication circuit 322 and/or the wireless communication circuit 324.

During the self-test procedure, the module control circuit 302 may be configured to control the lighting control device 350 to adjust the lighting load 370 to one or more intensities and measure a noise level at the connection 325 of the wireless communication circuit 324 at each intensity. The module control circuit 302 may be configured to measure the noise level at the connection 325 of the wireless communication circuit 324 by measuring a magnitude of the output signal $V_{SIG}$ of the wireless communication circuit when the connection 325 is idle (e.g., when the wireless communication circuit is not communicating a digital message to the module control circuit, and vice versa). For example, the module control circuit 302 may be configured to turn off the lighting load 370 and measure a first noise level at the connection 325 when the lighting load 370 is off. The module control circuit 302 may be configured to turn on the lighting load 370 (e.g., to the high-end intensity $L_{HE}$) and measure a second noise level at the connection 325 when the lighting load 370 is on. Rather than turning the lighting load 370 off or in addition to turning the lighting load off, the module control circuit 302 may be configured to turn the lighting load 370 on to the low-end intensity $L_{LE}$ and measure a third noise level at the connection 325 when the lighting load 370 is at the low-end intensity. In addition, the module control circuit 302 may be configured to adjust the intensity of the lighting load 370 to one or more intermediate intensities between the low-end intensity $L_{LE}$ and the high-end intensity $L_{HE}$ and measure respective noise levels. Further, the module control circuit 302 may be configured to adjust the color of the lighting load 370 to one or more colors (e.g., color temperatures) and measure respective noise levels.

The module control circuit 302 may be configured to process measurements of the noise level at the connection 325 of the wireless communication circuit 324 over a period of time (e.g., five seconds) to determine the noise level at each of the intensities to which the lighting load 370 is controlled. The module control circuit 302 may maintain the intensity of the lighting load 370 at each of the multiple intensities for the period of time while the module control circuit processes the measurements of the noise level at the connection 325. For example, the module control circuit 302 may be configured to calculate the average of the measurements of the noise level at the connection 325 over the period of time to determine the noise level at each of the intensities to which the lighting load 370 is controlled. In addition, the module control circuit 302 may be configured to determine the mean or median of the measurements of the magnitude of the noise level at the connection 325 over the period of time to determine the noise level. Further, the module control circuit 302 may be configured to execute advanced functions, such as a counting function, which may count samples of the noise level at the connection 325 that exceed a threshold during the period of time, to determine the noise level.

The module control circuit 302 may be configured to process the measured noise levels (e.g., the first and second noise levels) to determine if the self-test procedure has passed (e.g., the noise is acceptable) or failed (e.g., the noise is unacceptable). For example, the module control circuit 302 may compare the first noise level measured when the lighting load 370 is off to a first threshold and compare the second noise level measured when the lighting load 370 is on to a second threshold. For example, the first threshold may be the same as the second threshold. If either the first noise level exceeds the first threshold or the second noise level exceeds the second threshold, the module control circuit 302 may determine that the self-test procedure has resulted in a failure. The module control circuit 302 may also calculate a difference between the first and second noise levels and compare the difference to a third threshold. If the difference exceeds the third threshold, the module control circuit 302 may also determine that the self-test procedure has resulted in a failure. Otherwise, the module control circuit 302 may determine that the self-test procedure has resulted in a pass. Additionally or alternatively, the module control circuit 302 may be configured to process more than two measured noise levels to determine if the self-test procedure has passed or failed.

The module control circuit 302 may provide feedback indicating that the self-test procedure has resulted in a pass or a failure. For example, the module control circuit 302 may control the light source 314 to illuminate the light pipe to provide the feedback. The module control circuit 302 may blink the light pipe a first color (e.g., green) if the self-test procedure has resulted in a pass or a second color (e.g., red) if the self-test procedure has resulted in a failure. The module control circuit 302 may also flash the lighting load 370 to indicate that the self-test procedure has resulted in a failure. In addition, the module control circuit 302 may transmit a message indicating that the test has passed or failed via the wired communication circuit 322 and/or the wireless communication circuit 324. The module control circuit 302 may be configured to exit the self-test procedure after a timeout period (e.g., five minutes) from first indication of the results of the self-test procedure (e.g., from when the module control circuit begins to control the light source 314 to blink the light pipe to indicate that the test has passed or failed). The module control circuit 302 may also be configured to exit the self-test procedure in response to an actuation of a button of the actuator circuit 320 and/or in response to receiving a message via the wired communication circuit 322 and/or the wireless communication circuit 324.

Figure 4:
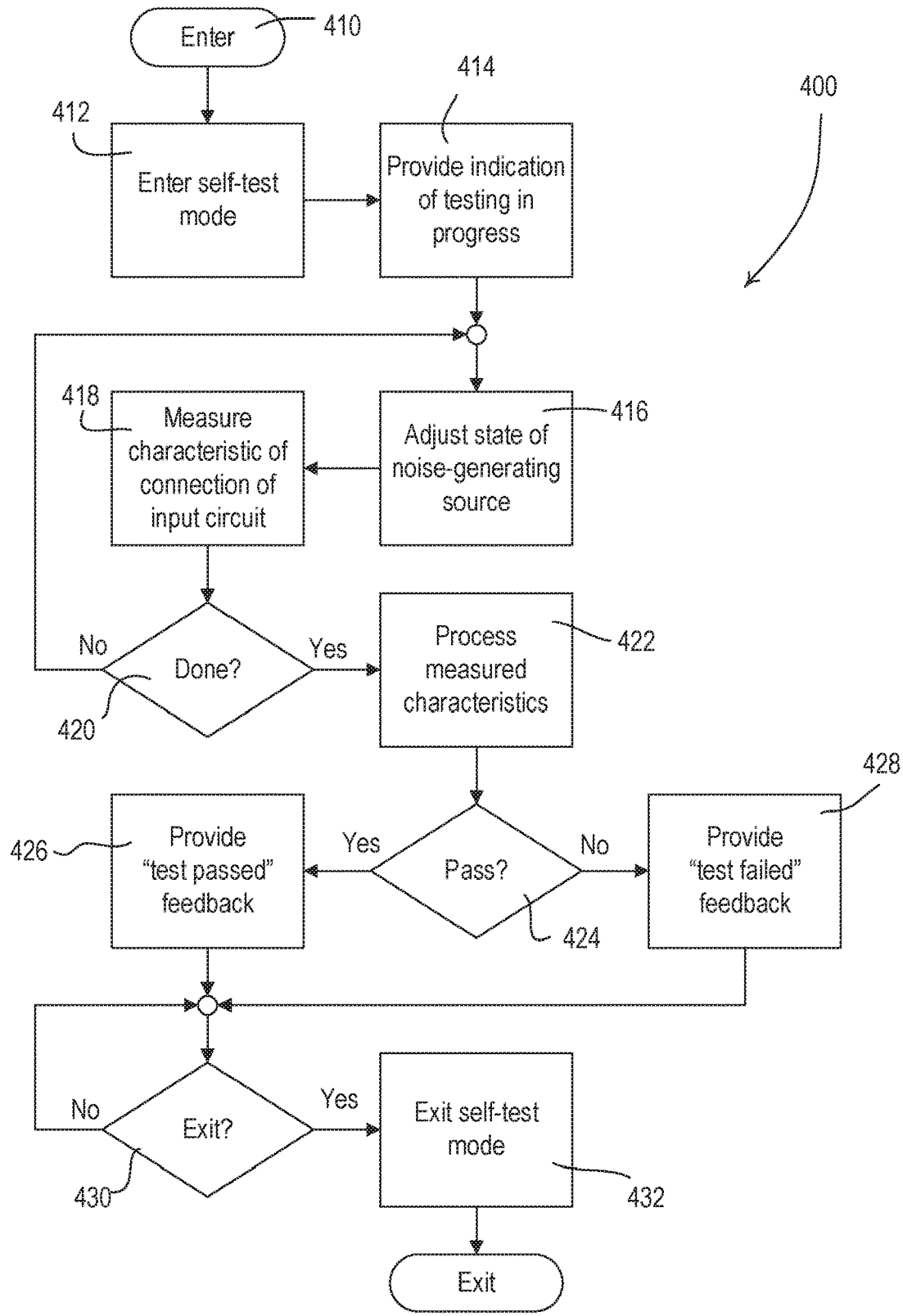
FIGS. 4 and 5 are flowcharts of example self-test procedures that may be executed by a control circuit of a control device.

FIG. 4 is a flowchart of an example self-test procedure 400 that may be executed by a control circuit of a control device (e.g., the control circuits of the control modules 120a-120d, the control circuit of the control module 200, and/or the module control circuit 302 of the control module 300). The control device may also comprise an input circuit (e.g., a wireless communication circuit, such as the wireless communication circuit 324 of the control module 300, and/or an occupancy sensing circuit, such as the occupancy sensing circuit 326 of the control module 300) that may generate an output signal at a connection, where the output signal may be susceptible to noise. The self-test procedure 400 may be executed at 410, for example, when the control module is powered up, when the control circuit is turning on a lighting load controlled by the control module, when a button of the control module is actuated, and/or when the control circuit receives a message (e.g., via a wired or wireless communication link). The control circuit may first enter a self-test mode at 412 and may provide indication that testing is in progress at 414. For example, the control circuit may blink a visual indicator (e.g., the light pipe 124 of the control modules 120a-120d shown in FIG. 1 and/or the light pipe 208 of the control module 200 shown in FIG. 2A) between two different colors (e.g., between green and red) at 414. While in the self-test mode, the control circuit may not be responsive to actuations of buttons of the control module and/or messages received from other control devices.

At 416, the control circuit may adjust the state of a noise-generating source, e.g., a lighting control device (such as the lighting control device 350) and/or a wireless communication circuit (such as the wireless communication circuit 358 of the lighting control device) in a lighting fixture of the control module. For example, the control circuit may control the lighting control device to turn off a lighting load and/or may disable the wireless communication circuit at 416. At 418, the control circuit may measure a characteristic of the connection of the input circuit (e.g., a characteristic of the output signal of the input circuit). For example, the control circuit may measure a noise level at a connection of the wireless communication circuit (e.g., a noise level of the output signal $V_{SIG}$) and/or a noise level at a connection of the occupancy sensing circuit (e.g., a noise level of the occupancy control signal $V_{OCC}$) at 418. The control circuit may calculate the noise level as an average of measurements taken over a period of time (e.g., five seconds) at 418. If the control circuit has other states to which to control the noise-generating source to measure the noise level at 420, the self-test procedure 400 may loop around to adjust the state of the noise-generating source at 416 and measure the noise level again at 418 (e.g., to record multiple noise levels). For example, the control circuit may control the lighting control device to turn on the lighting load to a high-end intensity and/or may enable the wireless communication circuit when 416 is executed the second time. The control circuit may measure a first noise level the first time that 418 is executed and a second noise level the second time that 418 is executed.

When the control circuit does not have other states to which to control the noise-generating source at 420, the control circuit may process the measured characteristics at 422 to determine if the test has passed. For example, the control circuit may compare the noise levels measured at 418 to one or more thresholds and determine that the test has passed if the noise levels are less than the respective thresholds. For example, the control circuit may compare the noise level at the connection of the wireless communication circuit to a first set of thresholds. The control circuit may compare the noise level at the connection of the occupancy sensing circuit to a second set of thresholds (e.g., different than the first set of thresholds used for the wireless communication circuit). In addition, the control circuit may calculate a difference between the first and second noise levels and compare the difference to a third threshold at 422. The control circuit may compare the difference to another threshold and determine that the test has passed if the difference is less than the threshold.

If the test has passed at 424, the control circuit may provide "test passed" feedback at 426. For example, the control circuit may blink the visual indicator a first color (e.g., green) at 426 to indicate that the test has passed. If the test has failed at 424, the control circuit may provide "test failed" feedback at 428. For example, the control circuit may blink the visual indicator a second color (e.g., red) at 428 to indicate that the test has failed. At 430, the control circuit may determine if the self-test procedure 400 should exit. For example, the control circuit may determine at 430 that the self-test procedure 400 should exit after a timeout period from when the control circuit provides the "test passed" feedback at 426 or the "test failed" feedback at 428. In addition, the control circuit may determine at 430 that the self-test procedure 400 should exit in response to receiving an indication of an actuation of a button and/or in response to receiving a message (e.g., via the wireless communication circuit). The control circuit may exit the self-test mode at 432, before the self-test procedure 400 exits.

Figure 5:
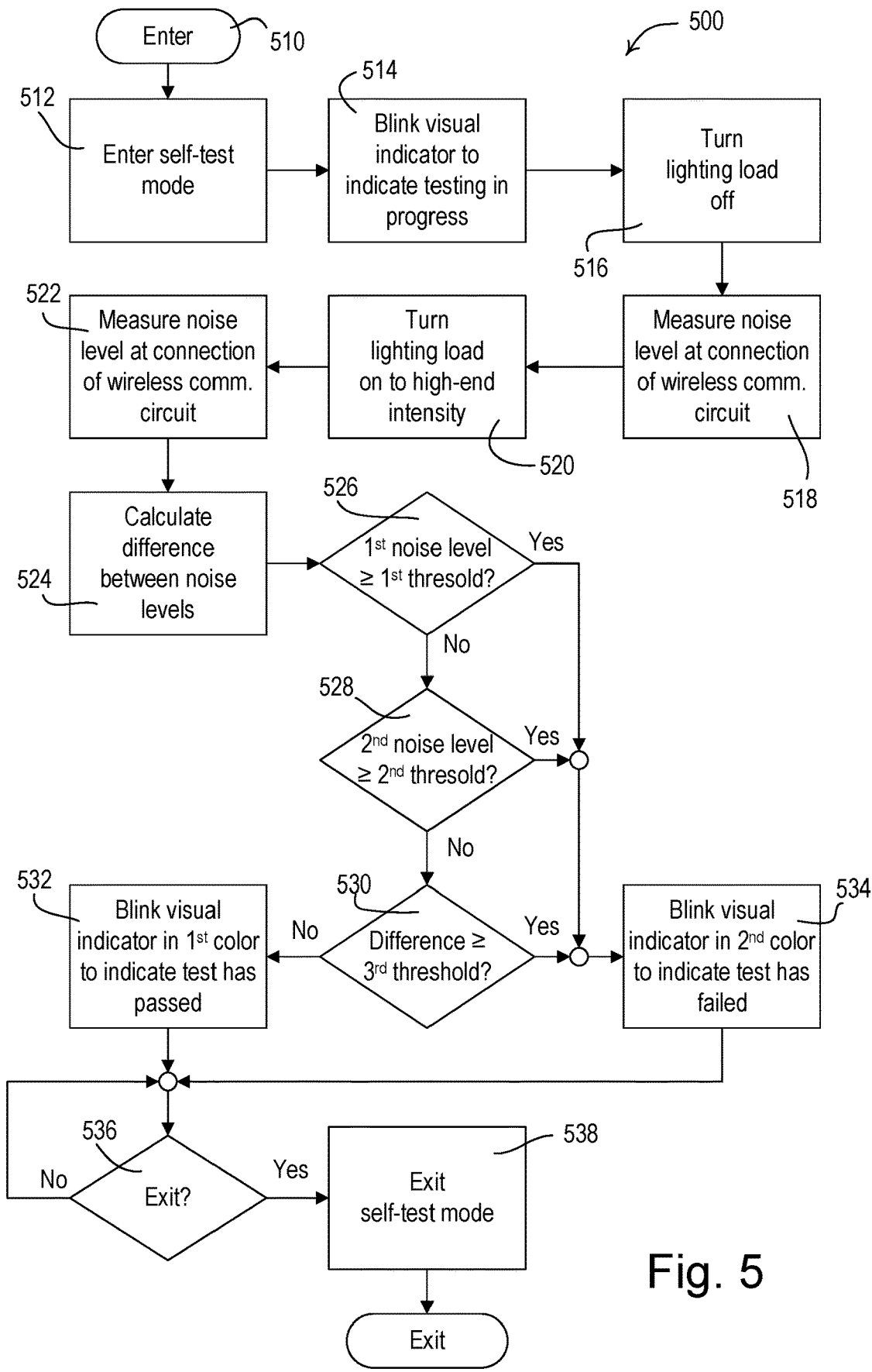

FIG. 5 is a flowchart of another example self-test procedure 500 that may be executed by a control circuit of a control device (e.g., the control circuits of the control modules 120a-120d, the control circuit of the control module 200, and/or the module control circuit 302 of the control module 300). The control device may comprise a wireless communication circuit (e.g., the wireless communication circuit 324 of the control module 300) that may generate an output signal at a connection. The output signal of the wireless communication circuit may be susceptible to noise that may be generated by a lighting control device and/or a lighting load controlled by the control module. The self-test procedure 500 may be executed at 510, for example, when the control module is powered up, when the control circuit is turning on a lighting load controlled by the control module, when a button of the control module is actuated, and/or when the control circuit receives a message (e.g., via a wired or wireless communication link). The control circuit may first enter a self-test mode at 512 and may provide indication that testing is in progress at 514. For example, the control circuit may blink a visual indicator (e.g., the light pipe 124 of the control modules 120a-120d shown in FIG. 1 and/or the light pipe 208 of the control module 200 shown in FIG. 2A) between two different colors (e.g., between green and red) at 514. While in the self-test mode, the control circuit may not be responsive to actuations of buttons of the control module and/or messages received from other control devices.

The control circuit may control the lighting control device to turn off the lighting load at 516 and may measure a first noise level at the connection of the wireless communication circuit at 518. For example, the control circuit may sample a voltage at the connection of the wireless communication circuit (e.g., the output signal $V_{SIG}$) multiple times during a sampling window (e.g., having a length of approximately five seconds), and determine a mean $\bar{x}$ and a standard deviation $\sigma$ of the samples recorded during the sampling window. The control circuit may then calculate the noise level N (e.g., the first noise level) using the determined mean $\bar{x}$ and standard deviation $\sigma$, e.g., $$N=\bar{x}+2\cdot\sigma.$$

The control circuit may then control the lighting control device to turn on the lighting load (e.g., to a high-end intensity) at 520 and may measure a second noise level at the connection of the wireless communication circuit at 522 (e.g., using a similar technique and equation as shown above for 518). At 524, the control circuit may calculate a difference between the first and second noise levels. If the first noise level is less than a first threshold (e.g., approximately −93 dBm) at 526, the second noise level is less than a second threshold (e.g., approximately −93 dBm) at 528, and the different between the first and second noise level is less than a third threshold (e.g., approximately 16 dB) at 530, the control circuit may blink the visual indicator a first color (e.g., green) at 532 to indicate that the test has passed. If the first noise level is greater than or equal to the first threshold at 526, the second noise level is greater than or equal to the second threshold at 528, or the different between the first and second noise level is greater than or equal to the third threshold at 530, the control circuit may blink the visual indicator a second color (e.g., red) at 534 to indicate that the test has failed.

At 536, the control circuit may determine if the self-test procedure 500 should exit. For example, the control circuit may determine at 530 that the self-test procedure 500 should exit after a timeout period from when the control circuit begins to blink the visual indicator the first color at 532 or begins to blink the visual indicator the second color at 534. In addition, the control circuit may determine at 530 that the self-test procedure 500 should exit in response to receiving an indication of an actuation of a button and/or in response to receiving a message (e.g., via the wireless communication circuit). The control circuit may exit the self-test mode at 538, before the self-test procedure 500 exits. While the self-test procedure 500 is shown as measuring noise levels at a connection of a wireless communication circuit, a similar self-test procedure may be executed to measure noise levels at a connection of an occupancy sensing circuit.

While the self-test procedures described herein have been described as executed by the control modules 120a-120d, 200, 300, the self-test procedures could be executed by other control devices of the load control system 100, such as the lighting control devices of the lighting fixtures 138a-138d and the lighting control device 350. In addition, parts of the self-test procedures could be executed in other control devices of the load control system 100, for example, in the system controller 160 and/or the network device 128. For example, the system controller 160 may transmit a command directly to one of the lighting control devices of the lighting fixtures 138a-138d to adjust the intensity of the respective lighting load. The system controller 160 may then cause the control module 120a-120d of the respective lighting fixture 138a-138d to measure the noise level at that intensity. The control modules 120a-120d may process the noise level(s) to determine whether the self-test procedure results in a pass or fail and/or may transmit the noise levels(s) to the system controller 160, which may process the noise levels to determine whether the self-test procedure results in a pass or fail.

Although features and elements are described herein in particular combinations, each feature or element can be used alone or in any combination with the other features and elements. The methods described herein may be implemented in a computer program, software, or firmware incorporated in a non-transitory, tangible computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), removable disks, and optical media such as CD-ROM disks, and digital versatile disks (DVDs).

The invention claimed is:

1. A control module for a lighting fixture including a lighting load, the control module comprising:
   an input circuit configured to generate an output signal at a connection;
   a visual indicator configured to be illuminated to provide feedback; and
   a control circuit configured to receive the output signal and to control the lighting load in response to the output signal;
   wherein the control circuit is configured to execute a self-test procedure during which the control circuit measures an electrical noise level at the connection of the input circuit when the input circuit is in an idle state and determines if the electrical noise level causes the self-test procedure to fail, the control circuit further configured to illuminate the visual indicator to provide a visual indication that the self-test procedure has failed.

2. The control module of claim 1, wherein the input circuit comprises a wireless communication circuit configured to receive wireless signals and the lighting load is controlled by a lighting control device, the lighting control device configured to control the lighting load to adjust an intensity of the lighting load.

3. The control module of claim 2, wherein the control circuit is configured to:
   control the lighting control device to adjust the intensity of the lighting load to a first intensity;
   measure a first electrical noise level at the connection when the lighting load is at the first intensity;
   control the lighting control device to adjust the intensity of the lighting load to a second intensity;
   measure a second electrical noise level at the connection when the lighting load is at the second intensity; and
   process the first and second electrical noise levels to determine if the self-test procedure failed.

4. The control module of claim 3, wherein the control circuit is configured to:
   calculate a difference between the first and second electrical noise levels; and
   determine that the self-test procedure failed when the difference between the first and second electrical noise levels exceeds a third threshold.

5. The control module of claim 1, wherein the control circuit is configured to blink the visual indicator a first color to indicate that the self-test procedure failed, and a second color different than the first color to indicate that the self-test procedure has passed.

6. The control module of claim 5, wherein the control circuit is configured to blink the visual indicator between the first color and the second color while the self-test procedure is executing.

7. The control module of claim 1, wherein the control circuit is configured to execute the self-test procedure when the control module is powered up.

8. The control module of claim 7, wherein, after the control module is powered for a predetermined amount of time, the control circuit is configured to cease re-executing the self-test procedure when the control module is subsequently powered up.

9. The control module of claim 1, wherein the control circuit is configured to execute the self-test procedure each time that the control module turns the lighting load on.

10. The control module of claim 1, wherein the control circuit is configured to execute the self-test procedure in response to receiving a message.

11. The control module of claim 1, wherein the control circuit is configured to execute the self-test procedure in response to an actuation of a button of the control module.

12. The control module of claim 1, wherein the input circuit comprises an occupancy sensing circuit.

13. The control module of claim 1, wherein the control circuit is configured to compare the electrical noise level to a threshold and to determine that the self-test procedure failed if the noise level exceeds the threshold.

14. A control module for a lighting fixture including a lighting load and an electrical noise-generating source, the control module comprising:
   an input circuit configured to generate an output signal at a connection; and
   a control circuit configured to receive the output signal and to control the lighting load in response to the output signal;
   wherein the control circuit is configured to control the electrical noise-generating source to a first state and measure a first electrical noise level at the connection of the input circuit when the noise-generating source is in the first state and the input circuit is in an idle state, the control circuit further configured to control the electrical noise-generating source to a second state and measure a second electrical noise level at the connection of the input circuit when the electrical noise-generating source is in the second state and the input circuit is in the idle state, the control circuit configured to process the first and second electrical noise levels and to provide an indication of a result of the processing of the first and second electrical noise levels.

15. The control module of claim 14, wherein the input circuit comprises a wireless communication circuit configured to receive wireless signals, and the electrical noise-generating source comprises a lighting control device of the lighting fixture, the lighting control device configured to control the lighting load to adjust an intensity of the lighting load.

16. The control module of claim 15, wherein the control circuit is configured to:
   control the lighting control device to adjust the intensity of the lighting load to a first intensity;
   measure the first noise level at the connection when the lighting load is at the first intensity;
   control the lighting control device to adjust the intensity of the lighting load to a second intensity; and measure the second noise level at the connection when the lighting load is at the second intensity.

17. The control module of claim 16, wherein the first intensity is off and the second is intensity is approximately 100%.

18. The control module of claim 16, wherein the first intensity is a low-end intensity of the lighting control device and the second is intensity is a high-end intensity of the lighting control device.

19. The control module of claim 14, wherein the control circuit is configured to:
compare the first electrical noise level to a first threshold;
compare the second electrical noise level to a second threshold; and
determine that a self-test procedure failed when at least one of the first electrical noise level exceeds the first threshold or the second electrical noise level exceeds the second threshold.

20. The control module of claim 19, wherein the control circuit is configured to:
calculate a difference between the first and second electrical noise levels; and
determine that the self-test procedure failed when the difference between the first and second noise levels exceeds a third threshold.

21. The control module of claim 14, wherein the control circuit is configured to:
control the noise-generating source to the first state for a first period of time and calculate the first noise level as an average of measurements of the output signal during the first period of time; and
control the noise-generating source to the second state for a second period of time and calculate the second noise level as an average of measurements of the output signal during the second period of time.

22. The control module of claim 14, wherein the first state is an off state of the electrical noise-generating source, and the second state is an on state of the electrical noise-generating source.

23. A lighting fixture comprising:
a lighting load;
a lighting control device coupled to the lighting load for controlling an intensity of the lighting load; and
a control module comprising a wireless communication circuit configured to receive wireless signals and generate an output signal at a connection, the control module configured to control the lighting control device to control the lighting load in response to the wireless signals received by the wireless communication circuit;
wherein the control module is configured to execute a self-test procedure during which the control module measures a first noise level at the connection of the wireless communication circuit when the intensity of the lighting load is at a first intensity and the wireless communication circuit is in an idle state, and measures a second noise level at the connection of the wireless communication circuit when the intensity of the lighting load is at a second intensity and the wireless communication circuit is in the idle state.

24. The lighting fixture of claim 23, wherein the first intensity is off and the second is intensity is approximately 100%.

25. The lighting fixture of claim 23, wherein the first intensity is a low-end intensity of the lighting control device and the second is intensity is a high-end intensity of the lighting control device.

* * * * *